US012625411B1

(12) United States Patent
Fenrich et al.

(10) Patent No.: US 12,625,411 B1
(45) Date of Patent: May 12, 2026

(54) TWO STEP PATTERNING METHODS FOR PHOTONIC DEVICES

(71) Applicant: PSIQUANTUM, CORP., Palo Alto, CA (US)

(72) Inventors: Colleen Shang Fenrich, Mountain View, CA (US); George Kovall, Campbell, CA (US)

(73) Assignee: PsiQuantum, Corp., Palo Alto, CA (US)

( * ) Notice: Subject to any disclaimer, the term of this patent is extended or adjusted under 35 U.S.C. 154(b) by 385 days.

(21) Appl. No.: 18/303,709

(22) Filed: Apr. 20, 2023

Related U.S. Application Data

(60) Provisional application No. 63/363,329, filed on Apr. 21, 2022.

(51) Int. Cl.
*H01J 37/32* (2006.01)
*G02F 1/21* (2006.01)
*G02F 1/225* (2006.01)

(52) U.S. Cl.
CPC .............. *G02F 1/212* (2021.01); *G02F 1/225* (2013.01); *H01J 37/32* (2013.01); *H01J 2237/334* (2013.01)

(58) Field of Classification Search
CPC ......... G02F 1/212; G02F 1/225; H01J 37/32; H01J 2237/334
See application file for complete search history.

(56) References Cited

U.S. PATENT DOCUMENTS

| | | | |
|---|---|---|---|
| 4,064,606 A | 12/1977 | Dunn | |
| 6,127,277 A * | 10/2000 | DeOrnellas | ......... H01L 21/3065 |
| | | | 438/711 |
| 6,368,517 B1 * | 4/2002 | Hwang | ................. H10D 1/692 |
| | | | 438/738 |
| 6,376,889 B1 | 4/2002 | Maeda et al. | |
| 6,436,838 B1 * | 8/2002 | Ying | ................. H01L 21/31144 |
| | | | 438/296 |
| 6,482,726 B1 | 11/2002 | Aminpur et al. | |
| 6,492,280 B1 * | 12/2002 | DeOrnellas | ....... H01L 21/02071 |
| | | | 438/711 |
| 6,666,986 B1 | 12/2003 | Vaartstra | |

(Continued)

FOREIGN PATENT DOCUMENTS

| | | | |
|---|---|---|---|
| GB | 2329783 A | 4/1999 | |
| WO | WO 2021/202445 A1 | 10/2021 | |

(Continued)

OTHER PUBLICATIONS

Abel, S. et al., "A Hybrid Barium Titanate-Silicon Photonics Platform for Ultraefficient Electro-Optic Tuning," Journal of Lightwave Technology, vol. 34, No. 8, pp. 1688-1693, Dec. 17, 2015 [retrieved on Jun. 25, 2021]. Retrieved from https://doi.org/10.1109/JLT.2015.2510282.

(Continued)

*Primary Examiner* — Binh X Tran
*Assistant Examiner* — Christopher Remavege
(74) *Attorney, Agent, or Firm* — THE MARBURY LAW GROUP PLLC

(57) ABSTRACT

An etching method includes forming a metal oxide layer that is a barium titanate layer or a strontium titanate layer over a substrate, and etching the metal oxide layer using atomic layer etching.

27 Claims, 17 Drawing Sheets

(56) References Cited

U.S. PATENT DOCUMENTS

| | | | | |
|---|---|---|---|---|
| 6,902,681 | B2 * | 6/2005 | Nallan | H01L 21/31122 438/689 |
| 7,094,704 | B2 * | 8/2006 | Jin | H01L 21/31122 438/712 |
| 11,842,900 | B2 * | 12/2023 | Asako | H10N 70/063 |
| 12,237,172 | B2 * | 2/2025 | Zhang | H01L 21/31116 |
| 2002/0037637 | A1 * | 3/2002 | Xing | H10B 53/30 257/E21.252 |
| 2002/0190024 | A1 * | 12/2002 | Eguchi | C23C 16/4405 118/724 |
| 2003/0170986 | A1 * | 9/2003 | Nallan | H01L 21/31116 257/E21.252 |
| 2003/0222296 | A1 * | 12/2003 | Kumar | H10D 1/68 257/E21.651 |
| 2004/0007561 | A1 * | 1/2004 | Nallan | H01L 21/31122 257/E21.253 |
| 2004/0104199 | A1 | 6/2004 | Uesugi et al. | |
| 2004/0151463 | A1 | 8/2004 | Talin et al. | |
| 2005/0176191 | A1 * | 8/2005 | Kumar | H01L 21/28114 257/E21.252 |
| 2007/0181928 | A1 | 8/2007 | Yamanishi et al. | |
| 2007/0187362 | A1 | 8/2007 | Nakagawa et al. | |
| 2008/0110491 | A1 | 5/2008 | Buller et al. | |
| 2008/0199975 | A1 * | 8/2008 | Park | H01L 21/0206 257/E21.252 |
| 2008/0253728 | A1 | 10/2008 | Sparacin et al. | |
| 2010/0099264 | A1 * | 4/2010 | Elers | H01L 21/31122 257/E21.218 |
| 2010/0289026 | A1 | 11/2010 | Yamazaki et al. | |
| 2013/0038981 | A1 | 2/2013 | Imanaka et al. | |
| 2015/0270140 | A1 * | 9/2015 | Gupta | H01L 21/32136 216/67 |
| 2021/0173281 | A1 * | 6/2021 | Koppens | G02F 1/2257 |
| 2021/0278595 | A1 | 9/2021 | Kumar | |
| 2021/0278738 | A1 | 9/2021 | Kumar | |
| 2023/0085078 | A1 * | 3/2023 | Miyoshi | H01L 21/32136 438/705 |
| 2023/0152520 | A1 * | 5/2023 | Johansson | G02B 6/136 385/14 |
| 2023/0374670 | A1 * | 11/2023 | Zhang | C23G 5/00 |

FOREIGN PATENT DOCUMENTS

| | | |
|---|---|---|
| WO | WO 2023/056082 A1 | 4/2023 |
| WO | WO 2023/056086 A1 | 4/2023 |

OTHER PUBLICATIONS

Acharya, S. et al., "Self-limiting atomic layer deposition of barium oxide and barium titanate thin films using a novel pyrrole based precursor," Journal of Materials Chemistry C, 2016, vol. 4, pp. 1945-1952, Dec. 22, 2015 [retrieved on Jun. 25, 2021]. Retrieved from https:/doi.org/10.1039/c5tc03561a.

Cunge, G. et al., "Ion flux composition in HBr/Cl2/O2 and HBr/Cl2/O2/CF4 chemistries during silicon etching in industrial high-density plasmas," Journal of Vacuum Science & Technology B: Microelectronics and Nanometer Structures Processing, Measurement, and Phenomena, vol. 20, Issue 5, pp. 2137-2148, Oct. 4, 2002 [retrieved on Jun. 25, 2021]. Retrieved from https:/doi.org/10.1116/1.1511219.

ISR—Notification of Transmittal of The International Search Report and Written Opinion of the International Searching Authority for International Patent Application No. PCT/US2021/024772, mailed Jul. 19, 2021, 10 pages.

ISR—Notification of Transmittal of The International Search Report and Written Opinion of the International Searching Authority for International Patent Application No. PCT/US2022/045513, mailed Jan. 17, 2023, 12 pages.

ISR—Notification of Transmittal of The International Search Report and Written Opinion of the International Searching Authority for International Patent Application No. PCT/US2022/045522, mailed Feb. 28, 2023, 11 pages.

IPRP—Notification Concerning Transmittal of Copy of the International Preliminary Report on Patentability and the Written Opinion of the International Searching Authority for International Patent Application No. PCT/US2021/024772, mailed on Oct. 13, 2022, 6 pages.

Samaco, "Introduction to Si-DRIE (Silicon Deep Reactive Ion Etching)," https://www.samcointl.com/introduction-to-si-drie-silicon-deep-reactive-ion-etching/#:-text=The%20processing%20method%20called%20Si.features%20with%20higher%20aspect%20ratios, viewed on Apr. 20, 2023.

* cited by examiner

TWO STEP PATTERNING METHODS FOR PHOTONIC DEVICES

FIELD

Embodiments herein relate generally to methods for etching materials to generate components of electro-optic devices such as phase shifters and switches.

BACKGROUND

Electro-optic (EO) modulators and optical switches are useful components for the control and manipulation of optical signals. Some EO modulators utilize free-carrier electro-refraction, free-carrier electro-absorption, the Pockel's effect, or the DC Kerr effect to modify optical properties during operation, for example, to change a phase of light propagating through the EO modulator or switch. Optical phase modulators may be used in integrated optics systems, waveguide structures, integrated optoelectronics, etc.

Despite the progress made in the field of EO modulators and switches, there is an ongoing need for improved methods and systems related to patterning and etching wafer stacks for use in EO modulators, switches, and related devices.

SUMMARY

An embodiment etching method includes forming a metal oxide layer that is a barium titanate layer or a strontium titanate layer over a substrate, and etching the metal oxide layer using atomic layer etching.

BRIEF DESCRIPTION OF THE DRAWINGS

The accompanying drawings, which are incorporated herein and constitute part of this specification, illustrate example embodiments of the disclosure, and together with the general description given above and the detailed description given below, serve to explain the features of the disclosure.

FIG. 9 is a schematic illustration of a thin $Si_3N_4$ hard mask that may be used to etch a wafer, according to various embodiments.

DETAILED DESCRIPTION

The various embodiments are described in detail with reference to the accompanying drawings. The drawings are not necessarily to scale, and are intended to illustrate various features of the disclosure. Wherever possible, the same reference numbers will be used throughout the drawings to refer to the same or like parts. References made to particular examples and implementations are for illustrative purposes, and are not intended to limit the scope of the disclosure or the claims.

It will also be understood that, although the terms first, second, etc. are, in some instances, used herein to describe various elements, these elements should not be limited by these terms. These terms are used only to distinguish one element from another. For example, a first electrode layer could be termed a second electrode layer, and, similarly, a second electrode layer could be termed a first electrode layer, without departing from the scope of the various described embodiments. The first electrode layer and the second electrode layer are both electrode layers, but they are not the same electrode layer.

Disclosed embodiments relate etching and patterning methods for constructing components of optical systems. Example embodiments are provided in the context of integrated optical systems that include active optical devices, but the disclosure is not limited to such examples and has wide applicability to a variety of optical and optoelectronic systems.

According to some embodiments, the active photonic devices described herein utilize electro-optic effects, such as free carrier induced refractive index variation in semiconductors, the Pockels effect, and/or the DC Kerr effect to implement modulation and/or switching of optical signals. Thus, embodiments are applicable to both modulators, in which the transmitted light is modulated either ON or OFF, or light is modulated with a partial change in transmission percentage, as well as optical switches, in which the transmitted light is output on a first output (e.g., waveguide) or a second output (e.g., waveguide) or an optical switch with more than two outputs, as well as more than one input. Thus, embodiments of this disclosure are applicable to a variety of system configurations including an M (input)×N (output) systems that utilize the methods, devices, and techniques discussed herein. Some embodiments also relate to electro-optic phase shifter devices, also referred to herein as phase adjustment sections, which may be employed within switches or modulators.

Figure 1:
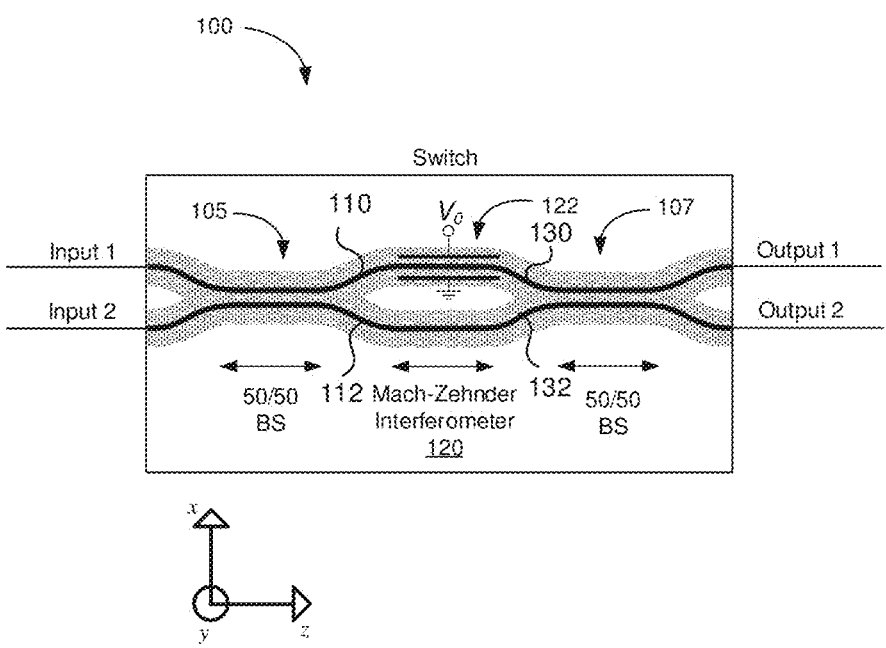
FIG. 1 is a simplified schematic diagram illustrating an optical switch, according to various embodiments.

FIG. 1 is a simplified schematic diagram illustrating an optical switch, according to various embodiments. Referring to FIG. 1, switch 100 includes two inputs: Input 1 and Input 2 as well as two outputs: Output 1 and Output 2. As an example, the inputs and outputs of switch 100 may be implemented as optical waveguides configured to support single mode or multimode optical beams. As an example, switch 100 may be implemented as a Mach-Zehnder interferometer coupled with a set of 50/50 beam splitters 105 and 107, respectively. As illustrated in FIG. 1, Input 1 and Input 2 are optically coupled to a first 50/50 beam splitter 105, also referred to as a directional coupler, which receives light from the Input 1 or Input 2 and, through evanescent coupling in the 50/50 beam splitter, directs 50% of the input light from Input 1 into waveguide 110 and 50% of the input light from Input 1 into waveguide 112. Concurrently, first 50/50 beam splitter 105 directs 50% of the input light from Input 2 into waveguide 110 and 50% of the input light from Input 2 into waveguide 112. Considering only input light from Input 1, the input light is split evenly between waveguides 110 and 112.

Mach-Zehnder interferometer 120 includes phase adjustment section 122. Voltage $V_0$ may be applied across the waveguide in phase adjustment section 122 such that it may have an index of refraction in phase adjustment section 122 that is controllably varied. Because light in waveguides 110 and 112 may still have a well-defined phase relationship (e.g., they may be in-phase, 180° out-of-phase, etc.) after propagation through the first 50/50 beam splitter 105, phase adjustment in phase adjustment section 122 may introduce a predetermined phase difference between the light propagating in waveguides 130 and 132. The phase relationship between the light propagating in waveguides 130 and 132 may cause output light to be present at Output 1 (e.g., light beams are in-phase) or Output 2 (e.g., light beams are out of phase), thereby providing switch functionality as light is directed to Output 1 or Output 2 as a function of the voltage $V_0$ applied at the phase adjustments section 122. Although a single active arm is illustrated in FIG. 1, in other embodiments both arms of the Mach-Zehnder interferometer may include phase adjustment sections.

As illustrated in FIG. 1, electro-optic switch technologies, in comparison to all-optical switch technologies, use an applied electrical bias (e.g., $V_0$ in FIG. 1) across the active region of the switch to produce optical variation. The electric field and/or current that is induced by application of this voltage bias causes changes in one or more optical properties of the active region, such as the index of refraction or absorbance. Although a Mach-Zehnder interferometer implementation is illustrated in FIG. 1, the disclosure is not limited to this particular switch architecture and other phase adjustment devices are included within the scope of this disclosure, including ring resonator designs, Mach-Zehnder modulators, generalized Mach-Zehnder modulators, and the like.

Figure 2:
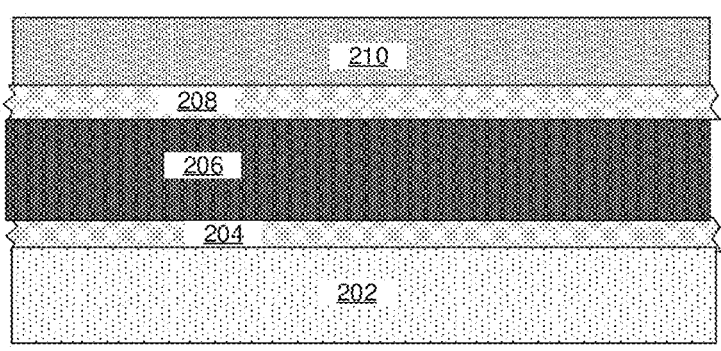
FIG. 2 is a schematic diagram of a pre-fabricated wafer including stacked layers, according to various embodiments.

The optical switch illustrated in FIG. 1 may include a waveguide structure that has been patterned from a wafer. FIG. 2 illustrates an example wafer that may be received from a wafer manufacturer and etched according to embodiments described herein, to produce the waveguide structure. FIG. 2 illustrates a cross section of a first wafer including a layer stack that may be received as part of a fabrication process for various devices described herein, according to various embodiments. As illustrated, a first insulating substrate layer 202 may be (optionally) disposed beneath a seed layer 204, which is disposed beneath an electro-optic layer 206, which is (optionally) disposed beneath an electrode layer 208, which is (optionally) disposed beneath a second insulating substrate layer 210. Alternatively, the electrode layer 208 may be located between the electro-optic layer 206 and the first insulating substrate layer 202. While FIG. 2 illustrates that each of the five layers 202 to 210 are present, any one or more of these layers may be absent, in various embodiments. In other words, the first wafer may be of various types depending on the specific fabrication method to be employed, and the seed layer, electrode layer, and second substrate layer may be optionally present or not present, as desired. One or more of the layers illustrated in FIG. 2 may be chemically etched to produce an electro-optical component, according to embodiments described herein.

Each of the layers of the wafer may be of any of a variety of types of materials. For example, the electrode layer 208 may include a conducting material such as a metal, or alternatively they may be composed of a semiconductor material. In various embodiments, the electrode layer may include one of gallium arsenide (GaAs), an aluminum gallium arsenide (AlGaAs)/GaAs heterostructure, an indium gallium arsenide (InGaAs)/GaAs heterostructure, zinc oxide (ZnO), zinc sulfide (ZnS), indium oxide (InO), doped silicon, strontium titanate (STO), doped STO, barium titanate (BTO), barium strontium titanate (BST), hafnium oxide, lithium niobite, zirconium oxide, titanium oxide, graphene oxide, tantalum oxide, lead zirconium titanate (PZT), lead lanthanum zirconium titanate (PLZT), strontium barium niobate (SBN), aluminum oxide, aluminum oxide, doped variants or solid solutions thereof, or a two-dimensional electron gas. For embodiments where the electrode layer may include doped STO, the STO may be either niobium doped or lanthanum doped, or include vacancies, according to various embodiments.

In various embodiments, the electro-optic layer 206 may include one or more of STO, BTO, BST, hafnium oxide, lithium niobite, zirconium oxide, titanium oxide, graphene oxide, tantalum oxide, PZT, PLZT, SBN, aluminum oxide, aluminum oxide, or doped variants or solid solutions thereof. The electro-optic layer may be composed of a transparent material having an index of refraction that is larger than an index of refraction of the first and second insulating substrate layers, in some embodiments.

Figure 3A:
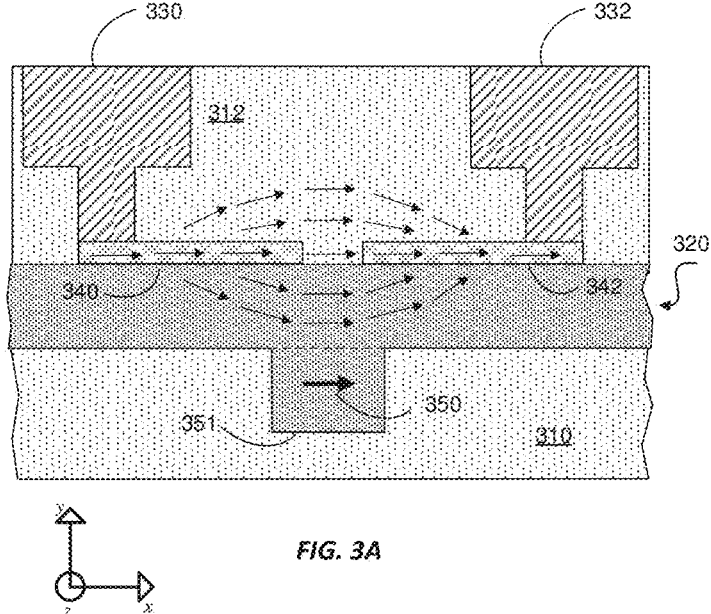
FIG. 3A is a simplified schematic diagram illustrating a cross section of a waveguide structure that shows the direction of an induced electric field, according to various embodiments.

FIG. 3A is a simplified schematic diagram illustrating a cross section of an example completed waveguide structure, where the direction of the induced electric field is illustrated with arrows, according to some embodiments. The waveguide structure illustrated in FIG. 3A may be fabricated from the wafer illustrated in FIG. 2 by performing etching techniques of embodiments described herein. FIG. 3A exhibits two electrical contacts, and each electrical contact includes a lead (330 and 332) connected to an electrode (340 and 342). It is noted that, as used herein, the term "electrode" refers to a device component that directly couples to the waveguide structure (e.g., to alter the voltage drop across the waveguide structure and actuate a photonic switch). Further, the term "lead" may refer to a backend structure that couples the electrodes to other components of the device (e.g., the leads may couple the electrodes to a controllable voltage source), but the leads are isolated from and do not directly couple to the waveguide structure. In some embodiments, the leads may be composed of a metal (e.g., copper, gold, etc.), or alternatively, a semiconductor material.

As illustrated, FIG. 3A illustrates a photonic device including first and second cladding layers, 310 and 312, on either side of the waveguide. It is noted that the terms "first" and "second" are meant simply to distinguish between the two cladding layers, and, for example, the term "first cladding layer" may refer to the cladding layer on either side of the waveguide.

FIG. 3A further illustrates a slab layer 320 including a first material that is coupled to the first electrode of the first electrical contact and the second electrode of the second electrical contact. In some embodiments, the waveguide structure further includes a ridge portion 351 composed of the first material (or a different material) and coupled to the slab layer, where the ridge portion is disposed between the first electrical contact and the second electrical contact.

As illustrated in FIG. 3A, the small arrows show the induced electric field direction which generally points along the positive x-direction through the electrodes of the device. The electric field curves in a convex manner both above and below the electrodes, as illustrated. Furthermore, the large arrow 350 pointing in the positive x-direction illustrates the direction of polarization of an optical mode that may travel through the slab layer and the waveguide.

Figure 3B:
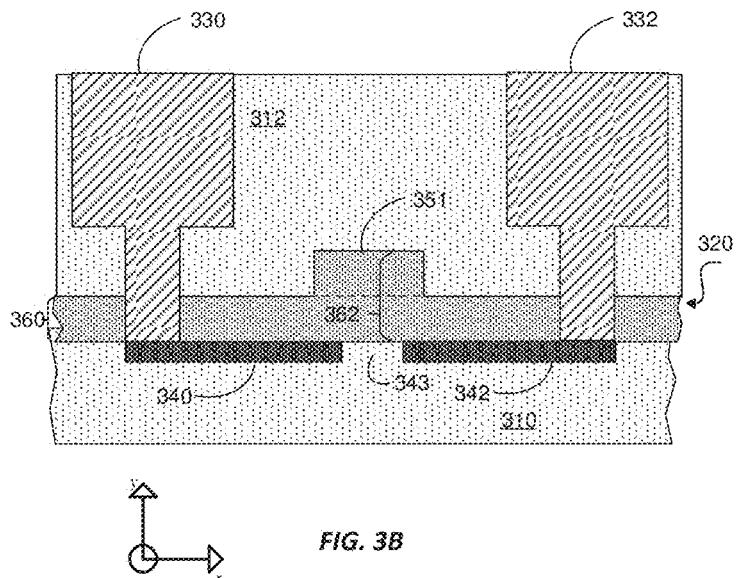
FIG. 3B is a simplified schematic diagram illustrating a cross section of a waveguide structure, according to various embodiments.

FIG. 3B illustrates an architecture where the ridge portion 351 of the waveguide structure is disposed on the top side of the slab layer and extends into a first cladding layer 312, the first electrode and the second electrode are coupled to the slab layer on the bottom side of the slab layer opposite the top side. As illustrated, the combination of the ridge portion and the slab layer has a first thickness 362 greater than a second thickness 360 of the slab layer alone 320, and the excess of the first thickness relative to the second thickness extends into the first cladding layer 312 on the top side of the slab layer 320. As illustrated in FIG. 3B, the first electrode 340 and the second electrode 342 may be coupled to the slab layer 320 on the bottom side of the slab layer opposite the top side. Further, the first electrical contact 330 may be coupled to the first electrode 340 by penetrating through the slab layer 320 from the top side of the slab layer to the bottom side of the slab layer, and the second electrical contact 332 may be coupled to the second electrode 342 by penetrating through the slab layer 320 from the top side of the slab layer to the bottom side of the slab layer.

Figure 4:
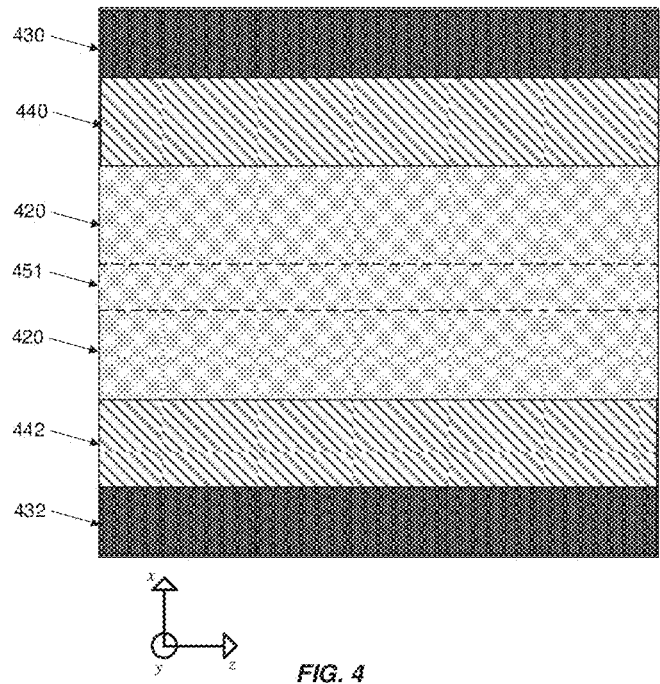
FIG. 4 is a simplified schematic diagram showing a top view of a waveguide structure, according to various embodiments.

FIG. 4 is a top-down view of a photonic phase-shifter architecture of FIGS. 3A and 3B, which may be patterned according to embodiments described herein. As illustrated, the phase-shifter may include first 430 and second 432 leads, first 440 and second 442 electrodes, a slab (e.g., waveguide) layer 420, and a ridge portion of the waveguide structure 451.

Figure 5:
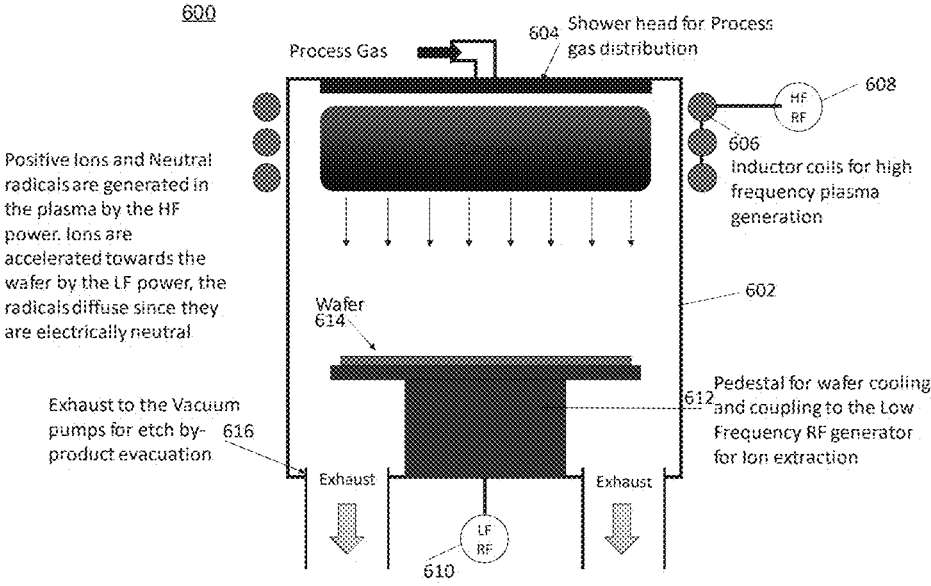
FIG. 5 is a schematic diagram of a wafer etching apparatus, according to various embodiments.

FIG. 5 is a schematic diagram illustrating a wafer etching apparatus 600, according to some embodiments. The illustrated wafer etching apparatus is one example of a wafer etching apparatus. Various other types of apparatus may be used in other embodiments to perform the etching processes described herein. As illustrated, a process gas (e.g., a combination of HBr and Cl₂, among other possibilities) may be inserted through the top of the etching process chamber 602, and distributed over the top region of the chamber using a shower head 604. As illustrated, inductor coils 606 wrapped around the chamber 602 are connected to a high frequency (HF) radio frequency (RF) generator (e.g., a 60 MHz RF generator) 608 which is configured to introduce a rapidly oscillating magnetic field within the chamber 602.

The induced oscillating field may interact with the process gas to ionize the gas. At the bottom of the chamber 602, a low frequency (LF) RF generator (e.g., typically a 13.5 MHz generator, or another frequency) 610 may be capacitively coupled to the pedestal 612 to introduce an oscillating capacitive charge on the top surface of the pedestal. This LF oscillating charge will accelerate ionized gas particles downward to collide with and chemically etch the wafer (e.g., the substrate containing one or more layers to be etched) 614 positioned on the pedestal 612. Finally, gaseous chemical by-products of the chemical etching reaction may be exhausted through a low-strength pump 616 at the bottom of the chamber 602.

Constructing the components of the electro-optical systems described above may involve an etching process to modify a wafer into an electro-optical component, such as a waveguide structure. Conventional methods for wafer etching exhibit limitations, and embodiments herein present improved methods for wafer etching.

Figure 6:
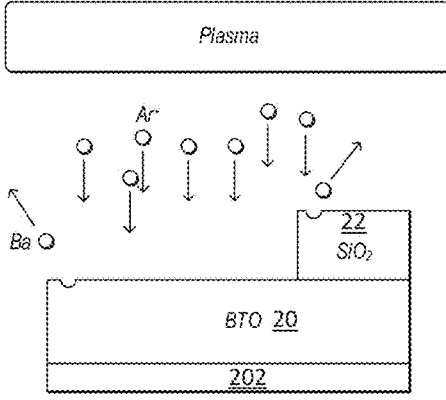
FIG. 6 is a schematic illustration of an ion milling etch procedure.

FIG. 6 illustrates an ion milling method for etching BTO (i.e., BaTiO₃). BTO is a difficult material to pattern using reactive ion etch (RIE), because BTO does not form volatile by-products with fluorine or chlorine, the halides commonly used in plasma etching. The chemical by-products of etching BTO using conventional fluorine and chlorine are non-volatile below approximately 1500° C. Accordingly, these by-products may not desorb from the wafer at the temperatures and pressures available in an RIE chamber. As a consequence, as illustrated in FIG. 6, some previous implementations for patterning a BTO layer 20 have been focused on ion-beam etching using argon, a process that is slow and has little selectivity to the mask (e.g., a silicon oxide hard mask) 22. During ion milling, argon ions are accelerated towards the BTO surface and physically break off barium and titanium atoms. These atoms are then pumped out through the exhaust. However, the etched atoms may often redeposit elsewhere on the surface of the wafer, causing undesirable defects. In addition, ion milling is non-selective so that effectively utilizing a hard mask may require the hard mask 22 to be thicker than the desired patterning depth, leading to increased material costs and etching time.

Figure 7:
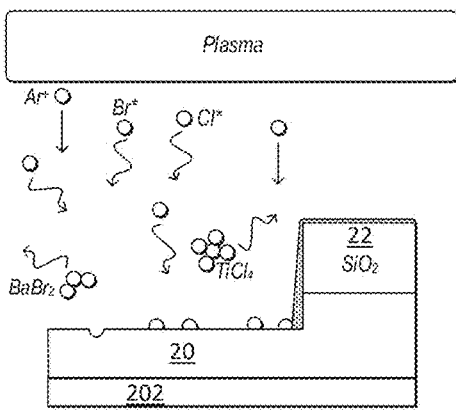
FIG. 7 is a schematic illustration of using ionized partial gas mixture to etch an electro-optic layer, according to various embodiments.

To address these and other concerns, embodiments herein provide a method where the BTO layer 20 is etched using a mixture of hydrogen bromide (HBr) and chlorine (Cl₂) to form the volatile by-products BaBr₂ and TiCl₄, respectively. As illustrated in FIG. 7, a partial gas mixture of HBr and Cl₂ is ionized, and this ionized gas is used to etch BTO. BaBr₂ becomes volatile at 120° C. at 1 atm pressure which is well within reach of conventional RIE chambers. In various embodiments, in order to pattern the wafer, several integration schemes with SiO₂ or Si₃N₄ hard masks 22, 24 may be used, as both materials are compatible with HBr/Cl₂ containing chemistries.

In some embodiments, formation of BaBr₂ may be assisted by the presence of oxygen, hydrogen, and/or argon ions in the plasma. The oxygen, hydrogen, and/or argon ions may be accelerated towards the surface at lower energy compared to that used for ion milling. The Br and Cl radicals are electrically neutral and may diffuse to the wafer surface. Both by-products readily desorb from the wafer surface and may be pumped out of the chamber without redepositing on the wafer.

Additional benefits are that the HBr/Cl$_2$ mixture is selective to SiO$_2$ or Si$_3$N$_4$ hard masks. The etch rate of BTO is also higher using a chemically assisted etch compared to a physical ion milling process and it has a lower risk of striations resulting in line edge roughness. FIGS. 8-11 illustrate different methods for utilizing a hard mask when patterning an electro-optic layer, according to various embodiments.

Figure 8:
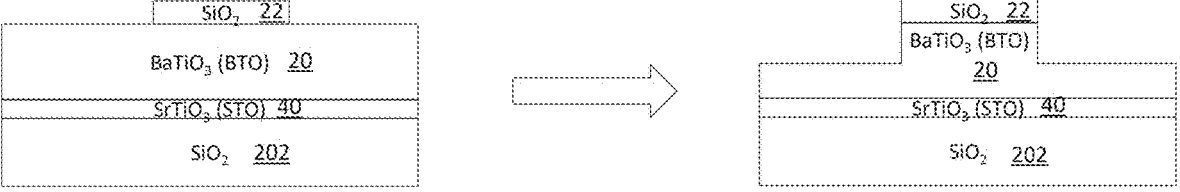
FIG. 8 is a schematic illustration of a thin $SiO_2$ hard mask that may be used to etch a wafer, according to various embodiments.

FIG. 8 illustrates utilization of a hard mask 22 of SiO$_2$ to pattern the BTO layer 20. In one embodiment, the BTO layer 20 may be used as the slab/ridge electro-optic layer 320 in the device of FIG. 3B. The SiO$_2$ hard mask 22 is selected because this material exhibits high selectivity to SiO$_2$ in HBr-based plasmas. The hard mask 22 may be patterned in a previous step. Optionally, an STO layer 40 may be located below the BTO layer 20. The STO layer 40 may be used to form the dielectric electrodes 340, 342 of FIG. 3B. The STO layer 40 may be patterned prior to forming the BTO layer 20 by any suitable method, such as ion milling. The optional STO layer 40 and the BTO layer 20 may be formed over the insulating substrate layer 202, such as a silicon dioxide or silicon nitride layer described above with respect to FIG. 2.

The insulating substrate layer 202 may be a temporary layer which is subsequently removed or may be a retained in the final electro-optic device as a cladding layer. Furthermore, the seed layer 204 may optionally also be formed below the BTO layer 20 as described above. The seed layer 204 may subsequently be removed or retained in the final electro-optic device. As illustrated, the BTO layer 20 is etched using the HBr/Cl$_2$ chemistry. In addition to the two main etching gases, O$_2$ is added for selectivity to the SiO$_2$ hard mask 22 as well as for profile control and argon is added to supply energy in the form of ion bombardment.

Figure 9:
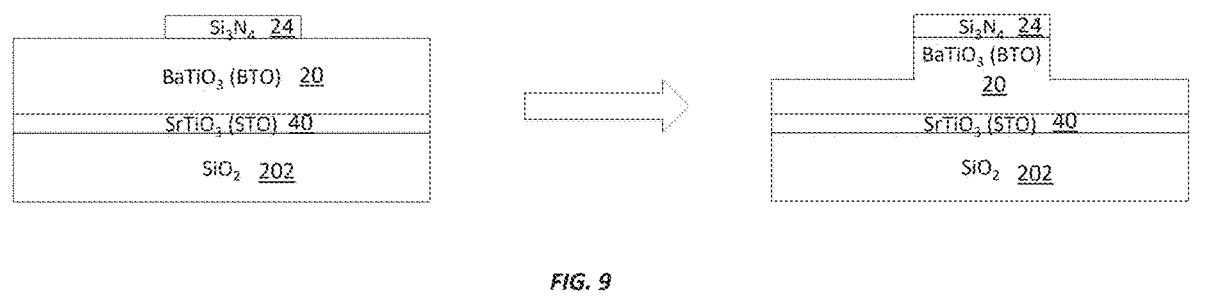

FIG. 9 illustrates utilizing a hard mask of silicon nitride (Si$_3$N$_4$) 24 to pattern the BTO layer 20. Silicon nitride is similar to silicon dioxide in that it is difficult to etch with HBr which causes high selectivity similar to the SiO$_2$ hard mask 22 case, the BTO layer 20 is etched using HBr/Cl$_2$ chemistry. In addition to the two main etching gases, O$_2$ is added for profile control and argon is added to supply energy in the form of ion bombardment just as in the case of SiO$_2$ hard mask.

Figure 10:
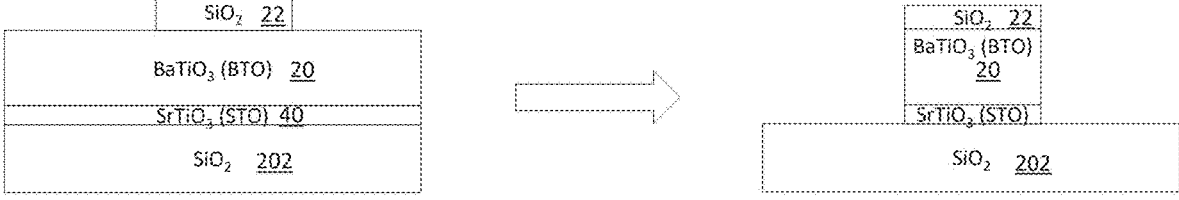
FIG. 10 is a schematic illustration of a thick $SiO_2$ hard mask that may be used to etch a wafer, according to various embodiments.

FIG. 10 illustrates a similar hard mask of SiO$_2$ 22 as shown in FIG. 8, which may be used to pattern the BTO layer 20 in some embodiments. The hard mask 22 is thicker than in FIG. 8 due to the increased etch depth. The BTO layer 20 and the STO layer 40 are etched together using the HBr/Cl$_2$ chemistry or by optionally using ion milling to etch the STO layer 40 after the BTO layer 20 is etched using the HBr/Cl$_2$ chemistry. In addition to the two main etching gases, O$_2$ is added for selectivity to the SiO$_2$ hard mask 22 as well as for profile control and argon is added to supply energy in the form of ion bombardment. In this embodiment, the full BTO stack is etched and the process stops on the SiO$_2$ insulating substrate layer 202 underneath.

Figure 11:
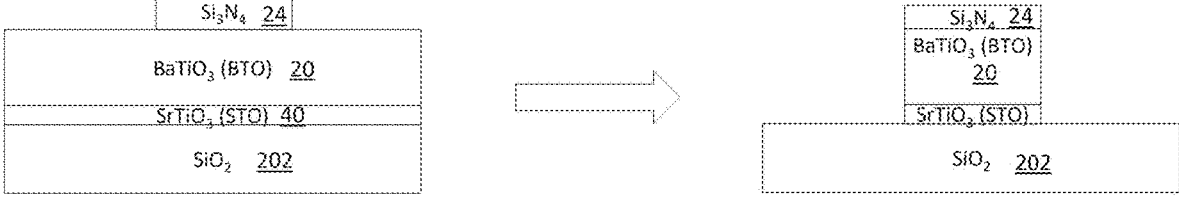
FIG. 11 is a schematic illustration of a thick $Si_3N_4$ hard mask that may be used to etch a wafer, according to various embodiments.

FIG. 11 illustrates a hard mask of Si$_3$N$_4$ 24, similar to that shown in FIG. 9, which may be used to pattern the BTO layer 20. The hard mask 24 is thicker than that shown in FIG. 9 to accommodate the increased etch depth. The BTO layer 20 and the STO layer 40 are etched together using the HBr/Cl$_2$ chemistry or by optionally using ion milling to etch the STO layer 40 after the BTO layer 20 is etched using the HBr/Cl$_2$ chemistry. In addition to the two main etching gases, O$_2$ is added for selectivity to the silicon nitride hard mask 22 as well as for profile control and argon is added to supply energy in the form of ion bombardment. In this embodiment, the full BTO stack is etched and the process stops on the SiO$_2$ insulating substrate layer 202 underneath.

Embodiments described herein for BTO layer 20 etching provide advantages over existing methods, such as ion milling using argon ions mixed with fluorine. Since the by-products produced by embodiments herein readily desorb from the surface, the produced wafer (i.e., the insulating substrate layer 202 supporting the etched BTO layer 20) may exit the process chamber 602 shown in FIG. 5 with fewer defects compared to wafers produced with ion milling processes. Additionally, chemically assisted etching has a higher etch rate, resulting in shorter processing times. Further, etching methods described according to some embodiments may have more tunable parameters such as pressure, power and gas composition that allows for improved control of the process. Embodiments herein offer improved selectivity to the hard mask, simplifying process integration. Chemical etching methods described herein are less physical than ion milling, reducing the risk of striations and edge channeling that in turn causes line edge roughness.

In some embodiments, HBr may react with moisture from the air and redeposit on the wafer. This re-deposition is referred to as time-dependent haze and may be dissolved during wafer cleaning. In some embodiments, non-processed wafers may be physically separated from processed wafers. This may prevent the haze from depositing on the surface of unprocessed wafers and causing micro-masking.

As described above, the use of conventional plasma dry etching to pattern BTO and STO thin films and materials may not be effective at removing Ba and Sr atoms because BTO does not form volatile by-products with fluorine or chlorine, the halides commonly used in plasma etching. The use of such a conventional approach, therefore, would require a plasma dry etch with a high sputter component. Using such a process, however, would cause faster erosion of the mask material and would thus cause the mask to have a lower etch selectivity. In this regard, a high sputter etch may increase micromask defects, residue, surface roughness. Furthermore, this may cause preferential etching of Ti over Ba or Sr due to higher volatilization of Ti etch products. One approach to avoid these problems is to use an etching process based on HBr and Cl$_2$, as described above with reference to FIGS. 7 to 11. In alternative embodiments, a two-step dry/wet etch may be used, as described in greater detail below.

The alternative embodiments use a first plasma dry etch to pattern BTO/STO materials with high fidelity followed by a wet etch to remove Ba and/or Sr containing residue by creating Ba and/or Sr containing etch products (e.g., Ba and/or Sr containing compound residue as a result of chemical reactions), which can be solubilized in an aqueous solution. The use of a two-step dry/wet etch process may have advantages over the use of either a dry or wet etch separately. In addition to the drawbacks of using a dry etch alone described above, a dry etch (e.g., ion beam etch or ion milling) may have a slow etch rate and may not be available for 300 mm wafer fabrication. The use of an isotropic wet etch alone may lead to rough line edge features due to preferential etching of grain boundaries or other defects. Furthermore, tight critical dimension (CD) and profile control (such as sidewall angle) may be difficult to maintain due to wet etch rate variability and isotropic behavior.

BTO and/or STO thin film (i.e., layer) patterning may be performed using a masking layer. A photoresist may be used as a masking layer in some embodiments, while other suitable masking materials (e.g., hard masks, such as silicon oxide, silicon nitride, metal, carbon, etc.) may be used in other embodiments. Portions of the BTO or STO film not covered by the masking layer may be subject to either chemical reaction or physical bombardment, or a combination of these two processes to remove the BTO film. In one embodiment, unmasked portions of the BTO or STO film may be completely or partially etched using a two-step dry/wet etch process without leaving any byproducts of the film or the process.

In a first step, a plasma dry etch process, which is an anisotropic etch process, may be used to define a patterned structure. Such an anisotropic etch may be used to preserve the CD defined by the mask material and to generate a low line edge roughness defined by a low edge roughness of edges of the mask material. Since the plasma dry etch may not effectively remove Ba and/or Sr containing residue (e.g., Ba and/or Sr containing compounds such as $BaF_2$, $BaCl_2$, $SrF_2$ and/or $SrCl_2$ that remain in etched areas, a second step including a wet etch chemistry that also etches BTO and STO may be applied to remove in solution the remaining Ba and/or Sr containing residue by dislodging the Ba and/or Sr containing residue, by dissolving Ba or Sr compounds, or by undercutting a portion of the film under the Ba and/or Sr containing residue. The wet etch may include a halogen-containing etchant chemistry, and optionally containing at least one of acid or oxidizer. However, non-halogen containing etchant chemistry may also be used.

Figure 12A:
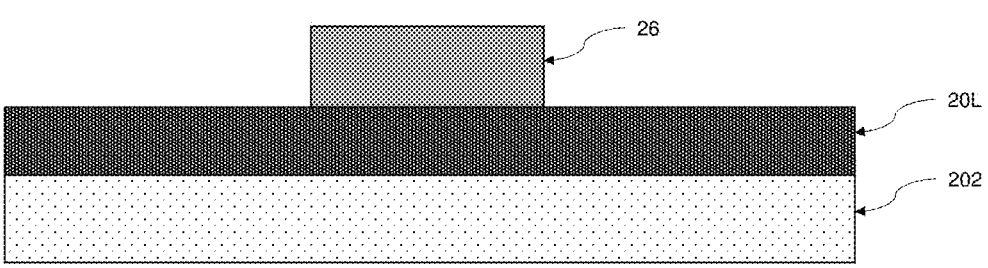
FIG. 12A is a vertical cross-sectional view of an intermediate structure that may be used in the formation of an optical component, according to various embodiments.

FIG. 12A is a vertical cross-sectional view of an intermediate structure 1200a that may be used in the formation of an optical component, according to various embodiments. The intermediate structure 1200a may include an electro-optic layer 20L formed over a substrate 202. The electro-optic layer 20L may be deposited as a blanket (i.e., un-patterned) layer and may include an electro-optic material, such as BTO or STO, as described above. The intermediate structure 1200a may further include a patterned masking layer, such as a patterned photoresist 26 (e.g., photoresist masking layer). Alternatively, $SiO_2$ or $Si_3N_4$ hard masks 22, 24 described above may be used as a masking layer instead. The patterned photoresist 26 may be formed by depositing a blanket layer (not shown) of photoresist material and patterning the photoresist material using photolithography techniques to form the patterned photoresist 26. The patterned photoresist 26 may then be used as a mask layer to selectively etch the electro-optic layer 20L.

Figure 12B:
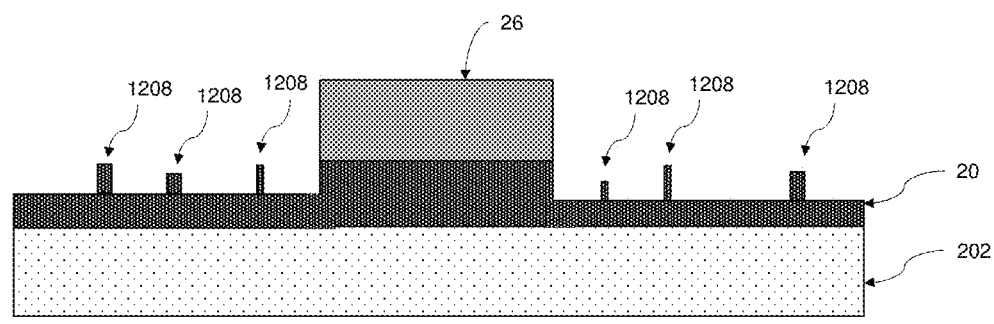
FIG. 12B is a vertical cross-sectional view of a further intermediate structure that may be used in the formation of an optical component, according to various embodiments.

FIG. 12B is a vertical cross-sectional view of an intermediate structure 1200b that may be used in the formation of an optical component, according to various embodiments. The intermediate structure 1200b of FIG. 12B includes an etched electro-optic layer 20 that may be formed after a first dry etch process is performed on the electro-optic layer 20L of FIG. 12A. In this embodiment, the dry etch may be stopped before etching through the entire thickness of the unmasked portions of the electro-optic layer 20L and before reaching the surface of the substrate 202 As shown in FIG. 12B, the etched electro-optic layer 20 may include various surface defects 1208 due to the incomplete removal of Ba and/or Sr components (e.g., Ba and/or Sr residue). A wet etch process may then be performed to remove the surface defects 1208 and to further etch the etched electro-optic layer 20, as described in greater detail with reference to FIG. 12C, below.

Figure 12C:
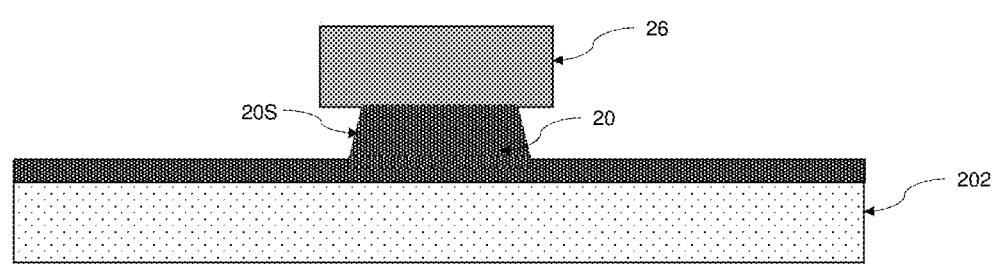
FIG. 12C is a vertical cross-sectional view of a further intermediate structure that may be used in the formation of an optical component, according to various embodiments.

FIG. 12C is a vertical cross-sectional view of an intermediate structure 1200c that may be used in the formation of an optical component, according to various embodiments. As shown in FIG. 12C, the wet etch process may be used to remove the surface defects 1208 left behind by the dry etch process. In this embodiment, the wet etch may be stopped before etching through the entire thickness of the unmasked portions of the electro-optic layer 20 and before reaching the surface of the substrate 202. As mentioned above, the wet etch is an isotropic etch, in contrast to the dry etch which is an anisotropic etch. Thus, as shown in FIG. 12C, the wet etch may remove portions of the etched electro-optic layer 20 under the patterned photoresist 26 thereby generating undercut regions with tapered sidewalls 20S.

Figure 13A:
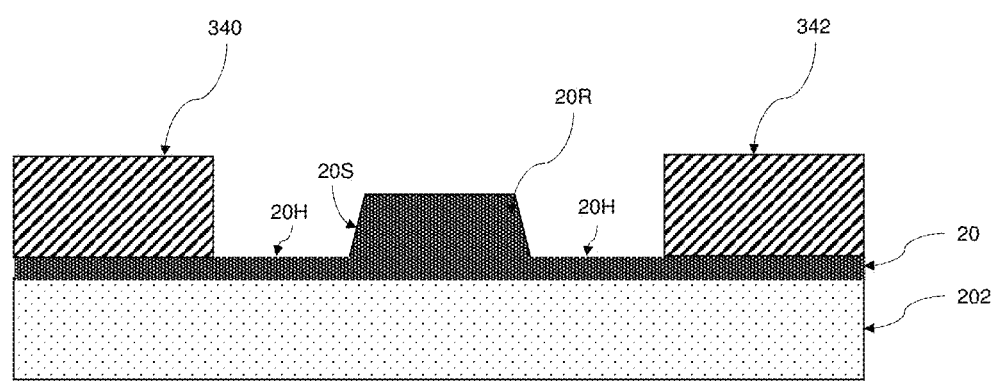
FIGS. 13A and 13B are vertical cross-sectional view of optical components, according to various embodiments.

FIG. 13A is a vertical cross-sectional view of an optical component 1300a, according to an embodiment. The optical component 1300a may be formed using processes described above with reference to FIGS. 12A to 12C. In this regard, a first dry etching process may be performed on an intermediate structure 1200a (e.g., see FIG. 12A) to generate the intermediate structure 1200b of FIG. 12B. A wet etch process may then be performed on the intermediate structure 1200b to remove the surface defects 1208 and to isotropically etch portions of the etched electro-optic layer 20 under the patterned photoresist 26. The etched electro-optic layer 20 of FIG. 13A may include a ridge portion 20R having tapered sidewalls 20S and horizontal layer portions 20H located on each side of the ridge portion 20R over the substrate 202. At least the ridge portion 20R may serve as a waveguide in the optical component 1300a. The optical component 1300a may then be formed by removing the patterned photoresist 26 (e.g., with a chemical solvent or by ashing) and by forming a first electrode 340 and a second electrode 342 on the horizontal portions 20H of the etched electro-optic layer 20.

Figure 13B:
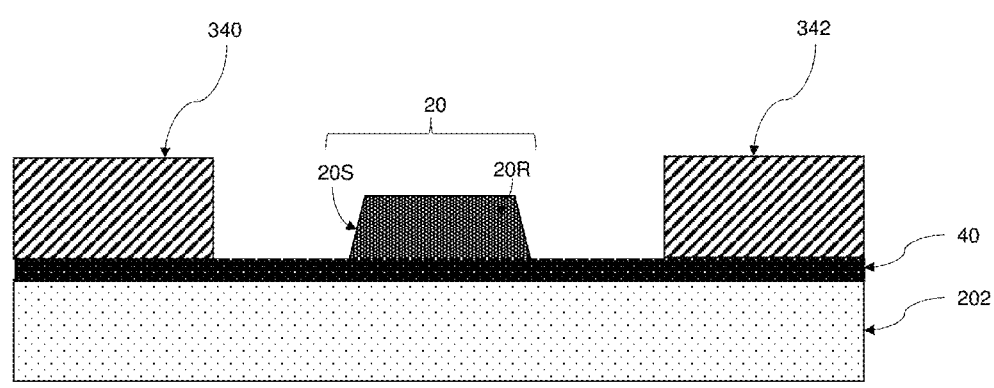

FIG. 13B is a vertical cross-sectional view of an optical component 1300b, according to an alternative embodiment. In this embodiment, the electro-optic layer 20 comprises the BTO layer, and an additional STO layer 40 is formed between the substrate 202 and the BTO layer. In this embodiment, the dry etch and/or the wet etch may etch through the entire thickness of the unmasked portions of the electro-optic layer (e.g., BTO layer) 20 and reach a surface of the underlying STO layer 40. The etched electro-optic layer 20 comprises just the ridge portion 20R having the tapered sidewalls 20S located on the underlying STO layer 40. Portions of the STO layer 40 may function as the dielectric electrodes, or additional electrodes 340, 342 may be formed on the STO layer 40 as shown in FIG. 13B.

The above-described two-step etching method may be implemented using various techniques for the dry and the wet etching processes. For example, dry etching processes may include: RIE, capacitively-coupled plasma RIE, inductively-coupled plasma RIE, electron-cyclotron resonance RIE, neutral loop density RIE, magnetically-enhanced RIE, ion milling or ion beam etch, gas cluster ion beam etch, etc. Exemplary dry etchant materials may include: Ar, $BCl_3$, $Cl_2$, $C_2HClF_4$, $CHClF_2$, $C_4F_8$, $C_4F_6$, $C_5F_8$, $CF_4$, $CH_4$, $CHF_3$, $SF_6$, HBr, $NF_3$, and/or halogen-containing etchants, etc. Etchant materials may further include various combinations of the above-referenced materials. These materials may further include additions of gases including $O_2$, $H_2$, He, $N_2$, CO and combinations of the above-described etching gases and gas additions.

Exemplary wet etchant materials may include: hydrofluoric acid, buffered hydrofluoric acid using ammonium fluoride, buffered oxide etch (BOE), hydrochloric acid, sulfuric acid, nitric acid, phosphoric acid, acetic acid, citric acid, ammonium hydroxide, and combinations of the above acids or bases. The above-described combinations of the above-described acids or bases may further include an oxidizer such as hydrogen peroxide.

Various other processes may be use in other embodiments. For example, ion beam etching (i.e., micromachining) may be used rather than dry plasma etching for the first etching step. The above-described embodiments include the use of a patterned photoresist as 26 as an etch mask. Alternatively, other materials may be used for the etch mask (e.g., such as silicon oxide or silicon nitride). In the embodiments of FIGS. 12A to 12C, the wet etch process was performed before removal of the patterned photoresist. Alternatively, the patterned photoresist may be removed prior to performing the wet etch. As described above, there are many ways to vary the wet etch chemistry to remove residual etch products. In the above-described embodiments, an anisotropic dry etch was followed by an isotropic wet etch. In further embodiments, the anisotropic dry etch may be followed by an isotropic dry etch to thereby undercut the material under the Ba and/or Sr. Residual etched materials may then be removed by rinsing the sample with a liquid.

In some embodiments, it may be advantageous to perform a wet etch before the dry etch. In this way, the first wet etch may act to clean the etching surface before the dry etch and to increase the taper of the sidewalls 20S if an increased taper is desired. In other embodiments, multiple sequences of dry/wet etch or other etch sequences (e.g., dry, wet, dry, wet; dry, dry; wet, wet; etc.) may be performed.

For example, a lower ion bombardment dry etch, such as a chemical dry etch may be performed first, to preserve the patterned photoresist 26. A higher ion bombardment etch, such as a sputter etch or ion beam milling, may be performed after the lower ion bombardment etch to remove the residue. Thus, removal or damage of the patterned photoresist 26 during higher ion bombardment etch is not critical, especially if the higher ion bombardment etch is performed for a shorter time than the lower ion bombardment etch to only remove the residue.

Thus, in various embodiments, any combination of ion beam etching, dry etching, and wet etching in series may be performed. Various tools may also be used for the wet etch step, such as a spray tool, a vapor tool, an etching bath, etc.

Figures 14A, 14B, 14C:
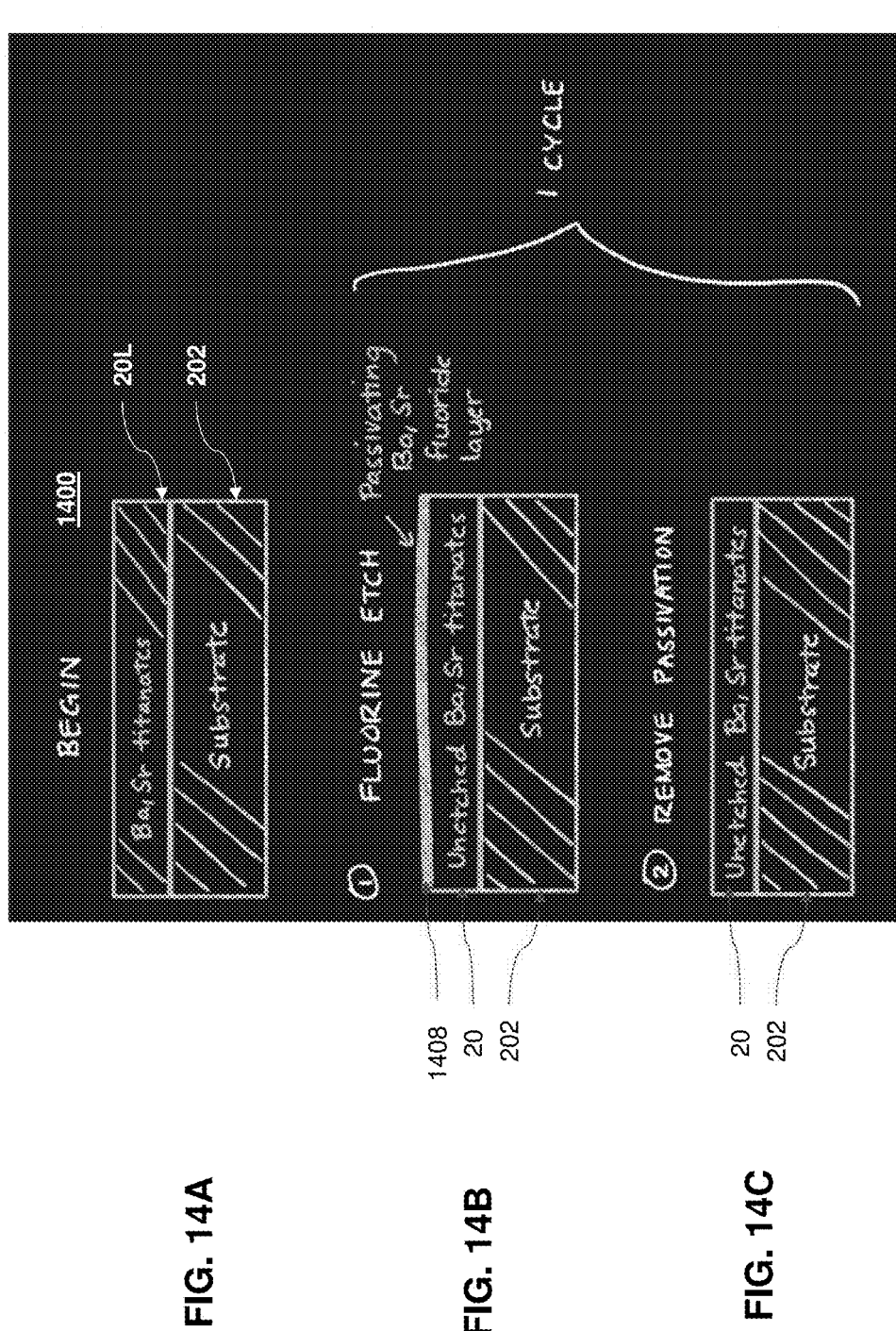
FIG. 14A is a vertical cross-sectional view of an intermediate structure that may be used in the formation of an optical component, according to various embodiments.
FIG. 14B is a vertical cross-sectional view of a further intermediate structure that may be used in the formation of an optical component, according to various embodiments.
FIG. 14C is a vertical cross-sectional view of a further intermediate structure that may be used in the formation of an optical component, according to various embodiments.

In an alternative embodiment of FIGS. 14A-14C, the two step etch described above with respect to FIGS. 12A-12C may comprise atomic layer etching (also known as a digital etching or layer-by-layer etching), in which a sequence alternating between first steps comprising self-limiting chemical modification steps which affect only the top atomic layer(s) of the electro-optic layer 20L, and second steps which comprise selective etching steps which remove only the chemically-modified areas, allows the removal of individual atomic layers of the electro-optic layer 20L. Each self-limiting step within one etch cycle either forms or removes a passivating (e.g., protective) layer (i.e., the chemically-modified area). This passivating layer is thin (e.g. one atomic layer up to 10 nanometers), which results in atomic-level or nanometer-level control of etch.

FIG. 14A is a vertical cross-sectional view of an intermediate structure 1400 that may be used in the formation of an optical component, according to various embodiments. The intermediate structure 1400 may be the same as the intermediate structure 1200a or it may be a different structure.

As shown in FIG. 14B, the first step comprising the self-limiting chemical modification step may be performed on the electro-optic layer 20L shown in FIG. 14A to form a barium halide and/or strontium halide passivating layer 1408 (i.e., the chemically-modified area) instead of the surface defects 1208 (e.g., residue) shown in FIG. 12B. The barium halide and/or strontium halide passivating layer 1408 may comprise a fluoride and/or a chloride passivating layer, such as a barium fluoride, strontium fluoride, barium chloride, strontium chloride, barium chloride fluoride, or strontium chloride fluoride passivating layer. The chemical modification step may comprise a fluorine based etch, such as a fluorine based plasma etch, such as a $CHF_3$ and/or a $CF_4$ plasma etch, a chlorine based etch, such as a chlorine based plasma etch, such as a $Cl_2$ and/or a $BCl_3$ plasma etch, or a combination fluorine and chlorine based etch, such as a combination plasma etch, such as a $CHClF_2$, $CCl_2F_2$, $CClF_3$, or $CCl_3F$ plasma etch. The etch converts exposed surface portions of the BTO or STO electro-optic layer 20L into barium or strontium halide passivating layer 1408 shown in FIG. 14A. The first step self-terminates once the passivating layer 1408 covers the surface of the exposed portions of the electro-optic layer 20 and inhibits further etchants (e.g., $CHF_3$, $CF_4$, $Cl_2$, $BCl_3$, $CHClF_2$, $CCl_2F_2$, $CClF_3$, or $CCl_3F$ plasma) from reaching and etching the underlying metal oxide (e.g., BTO or STO) electro-optic layer 20. In one embodiment, the physical sputtering component of the first step may be omitted or minimized. Thus, the argon ions in the etching gas may be minimized or omitted during the first step.

The second step selectively removes the chemically-modified areas (i.e., the metal halide passivating layer 1408) and may comprise a wet etching step which selectively etches metal halide passivating layer 1408 (e.g., barium or strontium halide layer) relative to the underlying metal oxide (e.g., BTO or STO) electro-optic layer 20, as shown in FIG. 14C. The selective wet etching step may comprise a selective acid etching step, such as a dilute nitric acid, an oxalic acid, a hydrochloric acid, a hydrofluoric acid, a hydroiodic acid, a hydrobromic acid, a perchloric acid, a sulfuric acid, a phosphoric acid, or an acetic acid etching step. Other acids described in prior embodiments may also be used. The acids may comprise an aqueous solution of the acid in a water solvent. A fluorine containing acid, such as hydrofluoric acid, may be used to etch a metal chloride passivating layer, while a chlorine containing acid, such as hydrochloric or perchloric acid may be used to etch a metal fluoride passivating layer.

In an alternative embodiment, if the metal halide passivating layer 1408 is water soluble, then water alone without an acid may be used during the second step to selectively remove the chemically-modified areas (i.e., the metal halide passivating layer 1408). For example, since barium chloride is water soluble, water without an acid or base may be used to selectively remove (e.g., dissolve) the barium chloride passivating layer 1408. Thus, the second step may be an acid based wet etch step or a water based dissolution step.

The second step self-terminates once all of the metal halide passivating layer 1408 is removed from the surface of the underlying metal oxide (i.e., barium or strontium titanate) electro-optic layer 20 because the second step is a selective etch which selectively etches the halide passivating layer 1408 selective to the metal oxide electro-optic layer 20.

The first and second steps described above may be repeated two or more times to etch the electro-optic layer 20 to a desired depth. Thus, in this embodiment, a series of etch steps are performed that are each self-limiting or very highly selective. As a result, the material removal stops (or proceeds extremely slowly) by the end of each step and will no longer be time-dependent. This means that no more material is removed with continued process time. The process then proceeds to the next step. Once both steps are complete, this completes one cycle. In this way, the "etch rate" is defined according to the "etch cycle" and the amount of material to be removed is given by a total number of cycles. This improves the precision of the etch depth without relying on timing. The non-volatile byproducts produced in the first plasma etch steps are used to achieve precise etch depth control dependent on cycle number instead of etch time. For example, if one cycle of the first and second steps removes 1 nm of the electro-optic layer, then the cycle etch rate is 1 nm per cycle. Three cycles are used to etch 3 nm. Thus, the alternating first and second steps described above are sequentially repeated three times to precisely etch the exposed portions of the electro-optic layer to a depth of 3 nm.

The above-described embodiments provide various advantages over conventional approaches that only use a single dry etch process. In the two-step etch process, critical feature dimensions with potentially low edge roughness may be formed using a dry etch process followed by a wet etch process to remove non-volatilized residual elements of Ba and/or Sr. A hard mask material is not required for the dry etch step since the residues do not need to be completely removed by the plasma dry etch. This is because any remaining residuals from the dry etch step may be removed by the wet etch step. As such, a soft, removable mask material, such as a photoresist, may be used as a mask for the dry etch process. The use of a photoresist rather than a hard mask has an advantage in that the process flow may be simplified. Further, a pattern CD and profile control may be improved using the plasma dry etch followed by a short wet etch, as compared to using a wet etch for the full material thickness. The wet etch may also improve the surface roughness resulting from the dry etch. The flexibility regarding the choice of wet etch processes may allow optimization of acid selection, solution composition, and solution concentrations.

The above-described etching method may be used in many applications including photonics (e.g., devices with electro-optic materials, oxide perovskite materials, optical switches, interferometers, etc.); microelectromechanical systems (MEMS) (e.g., disclosed embodiments may be used in thermal detectors to etch pixels in a focal plane arrays (FPA) and bolometers which use oxide perovskite materials); communications systems (e.g., disclosed embodiments may be used to pattern reflectarray antennas); memory devices (e.g., disclosed embodiments may be used to pattern thin film capacitors and varactors, e.g., DRAM with BTO, STO, or BST layers); high-k dielectrics, etc.

The foregoing descriptions are provided merely as illustrative examples and are not intended to require or imply that the steps of the various embodiments must be performed in the order presented. As may be appreciated by one of ordinary skill in the art, the order of steps in the foregoing embodiments may be performed in any order. Words such as "thereafter," "then," "next," etc., are not necessarily intended to limit the order of the steps; these words may be used to guide the reader through the description of the methods. Further, any reference to claim elements in the singular, for example, using the articles "a," "an," or "the," is not to be construed as limiting the element to the singular. Further, any step or component of any embodiment described herein may be used in any other embodiment.

The preceding description of the disclosed aspects is provided to enable persons of ordinary skill in the art to make and/or use the disclosed embodiments. Various modifications to these aspects may be readily apparent to those of ordinary skill in the art, and the generic principles defined herein may be applied to other aspects without departing from the scope of the disclosure. Thus, embodiments of the disclosure are not intended to be limited to the aspects shown herein but is to be accorded the widest scope consistent with the principles and novel features disclosed herein.

What is claimed is:

1. An etching method, comprising:
   forming a metal oxide layer comprising a barium titanate layer or a strontium titanate layer over a substrate; and
   etching the metal oxide layer using atomic layer etching, wherein:
   the atomic layer etching comprises a sequence alternating between a first step comprising a self-limiting chemical modification step which forms a passivating layer on the metal oxide layer, and a second step which comprises a self-limiting selective removal step which selectively removes the passivating layer relative to metal oxide layer located under the passivating layer,
   the first step and the second step are sequentially repeated two or more times;
   the passivating layer comprises a barium halide or a strontium halide passivating layer; and
   the second step comprises an acid based wet etching or a water based dissolution step.

2. The method of claim 1, wherein the barium halide or the strontium halide passivating layer comprises a barium fluoride, strontium fluoride, barium chloride, strontium chloride, barium chloride fluoride, or strontium chloride fluoride passivating layer.

3. The method of claim 2, wherein the first step comprises a fluorine based etch.

4. The method of claim 3, wherein the fluorine based etch comprises a fluorine based plasma etch, and the barium halide or the strontium halide passivating layer comprises the barium fluoride or the strontium fluoride passivating layer.

5. The method of claim 4, wherein the fluorine based plasma etch comprises a $CHF_3$ plasma etch or a $CF_4$ plasma etch.

6. The method of claim 2, wherein the first step comprises a chlorine based etch.

7. The method of claim 6, wherein the chlorine based etch comprises a chlorine based plasma etch, and the barium halide or the strontium halide passivating layer comprises the barium chloride or the strontium chloride passivating layer.

8. The method of claim 7, wherein the chlorine based plasma etch comprises a $Cl_2$ plasma or a $BCl_3$ plasma etch.

9. The method of claim 2, wherein the first step comprises a combination fluorine and chlorine based etch.

10. The method of claim 9, wherein the combination fluorine and chlorine based etch comprises a combination fluorine and chlorine based plasma etch, and the barium halide or the strontium halide passivating layer comprises the barium chloride fluoride or the strontium chloride fluoride passivating layer.

11. The method of claim 10, wherein the combination fluorine and chlorine based plasma etch comprises a $CHClF_2$, $CCl_2F_2$, $CClF_3$, or $CCl_3F$ plasma etch.

12. The method of claim 1, wherein the second step comprises the acid based wet etching step.

13. The method of claim 12, wherein the acid based wet etching step comprises a dilute nitric acid, an oxalic acid, a hydrochloric acid, a hydrofluoric acid, a hydroiodic acid, a hydrobromic acid, a perchloric acid, a sulfuric acid, a phosphoric acid, or an acetic acid wet etching step.

14. The method of claim 2, wherein the second step comprises the water based dissolution step.

15. The method of claim 14, wherein the barium halide or the strontium halide passivating layer comprises the barium chloride passivating layer.

16. The method of claim 1, wherein the metal oxide layer comprises a waveguide layer of a Mach-Zehnder interferometer.

17. The method of claim 1, wherein the metal oxide layer comprises the barium titanate layer.

18. The method of claim 17, further comprising forming a first electrode and a second electrode on the metal oxide layer.

19. The method of claim 1, wherein the metal oxide layer comprises the strontium titanate layer.

20. The method of claim 19, wherein the step of forming the metal oxide layer comprises forming the strontium titanate layer over a substrate and forming the barium titanate layer over the strontium titanate layer.

21. An etching method, comprising:

forming a metal oxide layer comprising a barium titanate layer or a strontium titanate layer over a substrate; and etching the metal oxide layer using atomic layer etching, wherein:

the atomic layer etching comprises a sequence alternating between a first step comprising a self-limiting chemical modification step which forms a passivating layer on the metal oxide layer, and a second step which comprises a self-limiting selective removal step which selectively removes the passivating layer relative to metal oxide layer located under the passivating layer;

the first step and the second step are sequentially repeated two or more times; and the passivating layer comprises a barium halide or a strontium halide passivating layer.

22. The method of claim 21, wherein the passivating layer comprises the barium halide layer.

23. The method of claim 21, wherein the passivating layer comprises the strontium halide passivating layer.

24. An etching method, comprising:

forming a metal oxide layer comprising a barium titanate layer or a strontium titanate layer over a substrate; and etching the metal oxide layer using atomic layer etching, wherein:

the atomic layer etching comprises a sequence alternating between a first step comprising a self-limiting chemical modification step which forms a passivating layer on the metal oxide layer, and a second step which comprises a self-limiting selective removal step which selectively removes the passivating layer relative to metal oxide layer located under the passivating layer;

the first step and the second step are sequentially repeated two or more times;

the first step comprises a fluorine based plasma etch;

the passivating layer comprises a barium fluoride or a strontium fluoride passivating layer; and the fluorine based plasma etch comprises a $CHF_3$ plasma etch or a $CF_4$ plasma etch.

25. The method of claim 24, wherein the fluorine based plasma etch comprises the $CHF_3$ plasma etch.

26. The method of claim 24, wherein the fluorine based plasma etch comprises the $CF_4$ plasma etch.

27. An etching method, comprising:

forming a metal oxide layer comprising a barium titanate layer or a strontium titanate layer over a substrate; and etching the metal oxide layer using atomic layer etching, wherein:

the atomic layer etching comprises a sequence alternating between a first step comprising a self-limiting chemical modification step which forms a passivating layer on the metal oxide layer, and a second step which comprises a self-limiting selective removal step which selectively removes the passivating layer relative to metal oxide layer located under the passivating layer;

the first step and the second step are sequentially repeated two or more times;

the first step comprises a combination fluorine and chlorine based plasma etch;

the passivating layer comprises a barium chloride fluoride or a strontium chloride fluoride passivating layer; and the combination fluorine and chlorine based plasma etch comprises a $CHClF_2$, $CCl_2F_2$, $CClF_3$, or $CCl_3F$ plasma etch.

* * * * *